United States Patent
Chen et al.

(10) Patent No.: US 10,718,635 B2
(45) Date of Patent: Jul. 21, 2020

(54) CONTACT DETECTION CIRCUIT OF FOUR-TERMINAL MEASUREMENT DEVICE

(71) Applicant: CHROMA ATE INC., Taoyuan (TW)

(72) Inventors: Tsz-Lang Chen, Taoyuan (TW); Ming-Chieh Lin, Taoyuan (TW); Yen-Ching Liu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 406 days.

(21) Appl. No.: 15/668,825

(22) Filed: Aug. 4, 2017

(65) Prior Publication Data
US 2018/0045537 A1    Feb. 15, 2018

(30) Foreign Application Priority Data

Aug. 12, 2016 (TW) .............................. 105125799 A

(51) Int. Cl.
| | |
|---|---|
| G01R 31/02 | (2006.01) |
| G01D 5/16 | (2006.01) |
| G01R 27/20 | (2006.01) |
| G01R 31/319 | (2006.01) |
| G01R 27/02 | (2006.01) |
| G01R 31/50 | (2020.01) |
| G01R 31/28 | (2006.01) |

(52) U.S. Cl.
CPC .............. *G01D 5/16* (2013.01); *G01R 27/205* (2013.01); *G01R 27/02* (2013.01); *G01R 31/28* (2013.01); *G01R 31/31924* (2013.01); *G01R 31/50* (2020.01)

(58) Field of Classification Search
CPC . G01R 27/205; G01R 31/002; G01F 31/3124; G01D 5/16
See application file for complete search history.

(56) References Cited

U.S. PATENT DOCUMENTS

| | | | | |
|---|---|---|---|---|
| 5,416,470 | A | * 5/1995 | Tanaka | G01R 27/26 324/133 |
| 2006/0279304 | A1* | 12/2006 | Kuitani | G01R 35/005 324/750.22 |
| 2014/0210484 | A1* | 7/2014 | Beck | H02H 3/044 324/509 |

* cited by examiner

*Primary Examiner* — Mohamed Charioui
*Assistant Examiner* — Christine Y Liao
(74) *Attorney, Agent, or Firm* — Maschoff Brennan

(57) ABSTRACT

A contact detection circuit is applied to a four-terminal measurement device. The contact detection circuit comprises a first isolator, a signal generator, a multiplier and a calculator. The first isolator comprises a primary side and a secondary side, with the secondary side comprising a first terminal and a second terminal, with the first terminal configured to be electrically connected to a driving terminal and the second terminal configured to be electrically connected to a measuring terminal. The signal generator is configured to provide a measuring signal. The multiplier is configured to generate an output signal based on the measuring signal and a first reflected signal when the first reflected signal is induced at the primary side of the first isolator based on the measuring signal. The calculator calculates contact resistance between the driving terminal and the measuring terminal based on a direct-current component of the output signal.

9 Claims, 3 Drawing Sheets

CONTACT DETECTION CIRCUIT OF FOUR-TERMINAL MEASUREMENT DEVICE

CROSS-REFERENCE TO RELATED APPLICATIONS

This non-provisional application claims priority under 35 U.S.C. § 119(a) on Patent Application No(s). 105125799 filed in Taiwan, R.O.C. Aug. 12, 2016, the entire contents of which are hereby incorporated by reference.

BACKGROUND

Technical Field

This disclosure relates to a detection device, and more particularly to a detection device for detecting the resistance between a measuring terminal and a driving terminal.

Related Art

Generally, when a subject is detected by high-precision measuring equipment, the measuring terminals, the transmission wires or other internal components of the high-precision measuring equipment may impact on the detection accuracy. As an example, a four-terminal measurement device (i.e. Kelvin-measurement device) outputs a driving signal to drive the subject via driving terminals, and measures a response signal via measuring terminals. The four-terminal measurement device detects the subject by the individual driving terminals and measuring terminals respectively to remove the voltage drop which occurs when the driving terminal transmits the driving signal to improve the detect accuracy. However, the wire resistance and the contact resistance between the transmission wires and the subject still impact on the detection accuracy of the four-terminal measurement device.

Furthermore, the wire resistance and the contact resistance between the transmission wires may change as the amount of usage and the usage time of the four-terminal measurement device increase. As a result, the detection result of the subject determined by the four-terminal measurement device may be more and more inaccuracy.

SUMMARY

This disclosure provides a contact detection circuit of a four-terminal measurement device in order to solve the problem about the detection accuracy.

According to one or more embodiments of this disclosure, a contact detection circuit is applied to a four-terminal measurement device. The contact detection circuit comprises a first isolator, a signal generator, a multiplier and a calculator. The first isolator comprises a primary side and a secondary side, with the secondary side comprising a first terminal and a second terminal, with the first terminal configured to be electrically connected to a driving terminal and the second terminal configured to be electrically connected to a measuring terminal. The signal generator is electrically connected to the primary side of the first isolator, and configured to provide a measuring signal. The multiplier is electrically connected to the signal generator and the primary side of the first isolator, and configured to generate an output signal based on the measuring signal and a first reflected signal when the first reflected signal is induced at the primary side of the first isolator based on the measuring signal. The calculator is electrically connected to the multiplier and calculates contact resistance between the driving terminal and the measuring terminal based on a direct-current component of the output signal.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
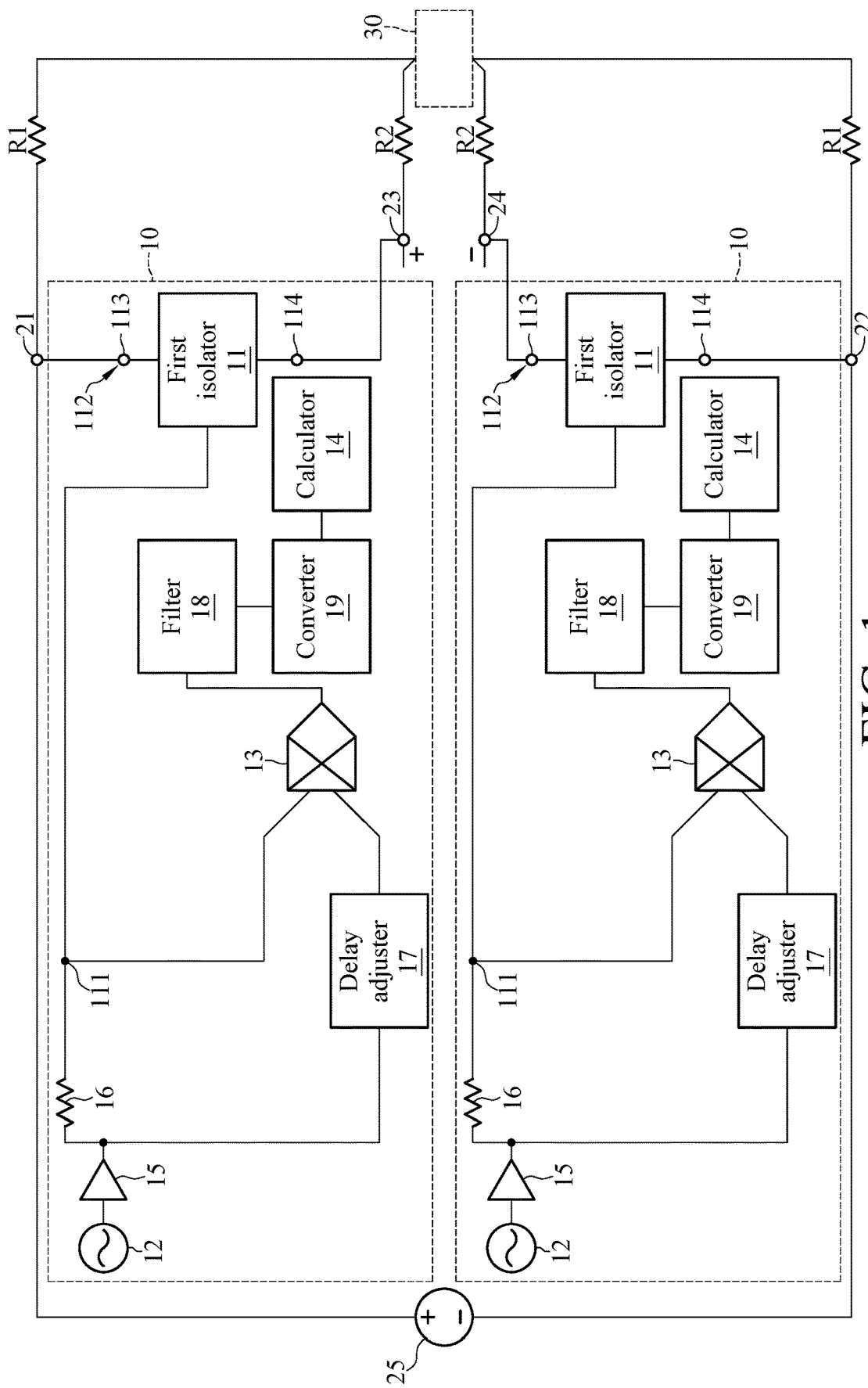
FIG. 1 is a schematic diagram of a contact detection circuit in an embodiment of this disclosure.

Please refer to FIG. 1. FIG. 1 is a schematic diagram of a contact detection circuit in an embodiment of this disclosure. As shown in FIG. 1, a contact detection circuit 10 is configured to measure the contact resistance between a driving terminal 21 and a measuring terminal 23. In an embodiment, the subject 30 is usually detected by four-terminal measurement (Kelvin measurement) or other appropriate methods of connection and measurement. A four-terminal measurement device for implementing said Kelvin measurement usually includes the driving terminal 21, a driving terminal 22, the measuring terminal 23 and a measuring terminal 24. The driving terminal 21 and the driving terminal 22 are electrically connected to a power generator 25, and transmit a driving signal provided by the power generator 25 to the subject 30. The measuring terminal 23 and the measuring terminal 24 are electrically connected to the subject 30, and configured to transmit the signal which is generated by the subject 30 based on the driving signal to a measuring equipment or another appropriate device; thereby, the measuring instrument or said another appropriate device determines the characteristic of the subject 30. For the driving terminal 21 and the measuring terminal 23 which are connected to the same terminal of the subject, the contact resistance is related to the contact resistance between the driving terminal 21 and the subject 30, and that between the measuring terminal 23 and the subject 30. More specifically, the contact resistance between the driving terminal 21 and the subject 30 includes the wire resistance of the transmission wire between the driving terminal 21 and the subject 30, the contact resistance between the driving terminal 21 and said transmission wire, and the contact resistance between said transmission wire and the subject 30. Similarly, the contact resistance between the measuring terminal 23 and the subject 30 includes the wire resistance of the transmission wire between the measuring terminal 23 and the subject 30, the contact resistance between the measuring terminal 23 and said transmission wire, and the contact resistance between said transmission wire and the subject 30. For the convenience of illustration, the contact resistance is shown as resistors R1 and R2 in FIG. 1. For example, the resistor R1 indicates the contact resistance between the driving terminal 21 and the subject 30, and the resistor R2 indicates the contact resistance between the measuring terminal 23 and the subject 30.

The contact detection circuit 10 includes a first isolator 11, a signal generator 12, a multiplier 13, a calculator 14, a buffer 15, a matching resistor 16, a delay adjuster 17, a filter 18 and a converter 19. The first isolator 11 includes a primary side 111 and a secondary side 112, with the secondary side 112 including a first terminal 113 and a second terminal 114. The first terminal 113 of the secondary side 112 is electrically connected to the driving terminal 21, and the second terminal 114 of the secondary side 112 is electrically connected to the measuring terminal 23. The signal generator 12 is electrically connected to the other terminal of the primary side 111 of the first isolator 11 via the buffer 15 and the matching resistor 16, and electrically connected to the multiplier 13 via the buffer 15 and the delay adjuster 17. The signal generator 12 is configured to provide a measuring signal to the first isolator 11 and the multiplier 13. In this embodiment, the measuring signal is transmitted to the delay adjuster 17 before provided to the multiplier 13. The measuring signal is adjusted by the delay adjuster 17 and then the adjusted measuring signal is provided to the multiplier 13. The input terminals of the multiplier 13 are respectively and electrically connected to the delay adjuster 17 and the primary side 111 of the first isolator 11, and the output terminal is electrically connected to the filter 18, the converter 19 and then the calculator 14. When the subject 30 generates a response signal at the secondary side 112 of the first isolator 11 to respond to an induced measuring signal from the first isolator 11, a reflected signal is induced at the primary side 111. The multiplier 13 generates an output signal based on the reflected signal at the primary side 111 and the adjusted measuring signal from the delay adjuster 17. The calculator 14 is electrically connected to the multiplier 13, and calculates the contact resistance between the driving terminal 21 and the measuring terminal 23 based on the direct-current component of the output signal.

More specifically, the measuring signal provided by the signal generator 12 is a sine wave or another appropriate measuring wave. Being exemplified with a sine wave as the measuring signal, the measuring signal is transmitted to the delay adjuster 17 after passing through the buffer 15 and the matching resistor 16. The measuring signal is also transmitted to the primary side 111 of the first isolator 11 through the matching resistor 16. An induced measuring signal is induced based on the measuring signal at the secondary side 112 by the first isolator 11, and then the induced measuring signal is transmitted to the subject 30 via the first terminal 113 and the second terminal 114 of the first isolator 11. The induced measuring signal is transmitted on the current path formed by the first isolator 11 and the subject 30, so that the response signal is generated based on the induced measuring signal. The response signal then passes through the first isolator 11 so that the reflected signal is induced based on the response signal at the primary side 111. In practice, the first isolator 11 is, for example, a transformer, a coupler or other appropriate component. The primary side 111 and the secondary side 112 of the first isolator 11 are isolated from each other. The first isolator 11 receives the measuring signal by the primary side 111 and induces the induced measuring signal at the secondary side 112, and then the loop circuit between the secondary side 112 and the subject 30 generates the response signal to respond to the induced measuring signal. When the response signal passes through the first isolator 11, the reflected signal is induced based on the response signal at the primary side 111 of the first isolator 11.

The reflected signal generated at the primary side 111 of the first isolator 11 is transmitted to the first input terminal of the multiplier 13. The measuring signal is adjusted as passing through the delay adjuster 17, and then the adjusted measuring signal is transmitted to the second input terminal of the multiplier 13. The delay adjuster 17 adjusts the phase of the measuring signal to be equal to that of the reflected signal based on the phase difference between the measuring signal and the reflected signal, and then transmits the adjusted measuring signal to the second input terminal of the multiplier 13. More specifically, there is a phase difference between the reflected signal and the measuring signal because it takes a while from inputting the measuring signal in the first isolator 11 to generating the reflected signal at the primary side 111 of the first isolator 11. Therefore, the delay adjuster 17 is configured to adjust the phase of the measuring signal to be equal to that of the reflected signal. In practice, the delay adjuster 17 may adjust the phase of the measuring signal by predicting the phase difference between the reflected signal and the measuring signal, or by receiving the reflected signal and determining the phase difference between the reflected signal and the measuring signal; it's not limited in this disclosure. When the multiplier 13 receives the reflected signal and the adjusted measuring signal which have the same phase, the multiplier 13 multiplies the reflected signal and the adjusted measuring signal together to generate an output signal, with the output signal including a double-frequency component and a direct-current component.

The calculator 14 determines the contact resistance based on the direct-current component of the output signal. In an embodiment, the output signal generated by the multiplier 13 is further transmitted to the filter 18. The filter 18 filters the output signal and provides the converter 19 with the direct-current component of the output signal. For example, the converter 19 is an analog-digital converter or other appropriate converters, and configured to detect the direct-current component of the output signal, to converse it into a measured value, and then to output the measured value to the calculator 14. The calculator 14 calculates the contact resistance based on the measured value.

In an embodiment, the calculator 14 searches for the resistance corresponding to the measured value from a lookup table by a lookup unit. In another embodiment, the calculator 14 collects and organizes a number of detection results of contact resistance, and deduces a relational expression about the relation between the measured value and the contact resistance. The calculator 14 substitutes the detected measured value into said relational expression to obtain the contact resistance, with the detected measured value obtained by detecting the subject 30. Besides, a person having ordinary skill in the art may determine the contact resistance by other methods which are not limited to these embodiments.

In the above embodiments, the delay adjuster 17 is disposed between the signal generator 12 and the multiplier 13 to adjust the phase of the measuring signal to be equal to that of the reflected signal. In yet another embodiment, the delay adjuster 17 can also be disposed between the primary side 111 and the multiplier 13 to adjust the phase of the reflected signal to be equal to that of the measuring signal; it's not limited in this disclosure.

In practice, the length of the path for signal transmission impacts the phase of the measuring signal and that of the reflected signal. The contact resistance impacts the amplitude of the measuring signal and that of the reflected signal. In other words, when the measuring signal passes through the resistors R1 and R2 respectively and the reflected signal is induced at the primary side 111 of the first isolator 11, the amplitude of the reflected signal is related to the contact resistance. After the adjusted reflected signal and the measuring signal multiply with each other, with the phase of the adjusted reflected equal to that of the measuring signal, the direct-current component of the output signal is related to the amplitudes of the measuring signal and the reflected signal rather than the phases of said two signals. Therefore, the calculator 14 may easily detect the contact resistance based on the direct-current component of the output signal.

For a practical example, the reflected signal is A sin(ωt+θ$_1$) and the measuring signal is B sin(ωt+θ$_2$). When the phase of the reflected signal is adjusted by the delay adjuster 17, θ$_1$ is adjusted to be equal to θ$_2$, and when the phase of the measuring signal is adjusted by the delay adjuster 17, θ$_2$ is adjusted to be equal to θ$_1$. In other words, no matter whether the reflected signal or the measuring signal is adjusted, these two signals have the same phases after phase adjustment. Therefore, for the convenience of explanation, after the phase adjustment, the adjusted reflected signal/reflected signal and the measuring signal/adjusted measuring signal are respectively named as A sin(ωt+θ$_3$) and B sin(ωt+θ$_3$), and these two signals multiply to obtain the output signal as follows:

$$A\sin(\omega t + \theta_3) \times B\sin(\omega t + \theta_3) = \frac{AB}{2}[\cos(0) - \cos(2\omega t + 2\theta_3)])$$

The calculator 14 determines the contact resistance based on the direct-current component $$\frac{AB}{2}\cos(0)$$

of the output signal.

In the above embodiments, for the convenience of explanation, the contact detection circuit 10 including the buffer 15, the matching resistor 16, the delay adjuster 17, the filter 18 and the converter 19 is exemplified. However, the buffer 15, the matching resistor 16, the delay adjuster 17, the filter 18 and the converter 19 are dispensable components for the contact detection circuit 10. A person having ordinary skill in the art can delete one or more of the buffer 15, the matching resistor 16, the delay adjuster 17, the filter 18 and the converter 19 or replace one or more of them with other appropriate components according to practical requirements; it's not limited in this disclosure. In an embodiment, there is no delay adjuster 17 included in the contact detection circuit 10. The multiplier 13 generates the output signal based on the reflected signal and the measuring signal. In other words, the output signal belongs to a function of the reflected signal and the measuring signal. In the aforementioned embodiment, the delay adjuster 17 included in the contact detection circuit 10 adjusts the measuring signal or the reflected signal, so the multiplier 13 generates the output signal based on the adjusted measuring signal and the reflected signal, or based on the measuring signal and the reflected signal. The output signal also belongs to the function of the reflected signal and the measuring signal.

Besides being disposed between the driving terminal 21 and the measuring terminal 23, the contact detection circuit 10 can be disposed between the driving terminal 22 and the measuring terminal 23 in order to detect the contact resistance between the driving terminal 22 and the measuring terminal 24.

Figure 2:
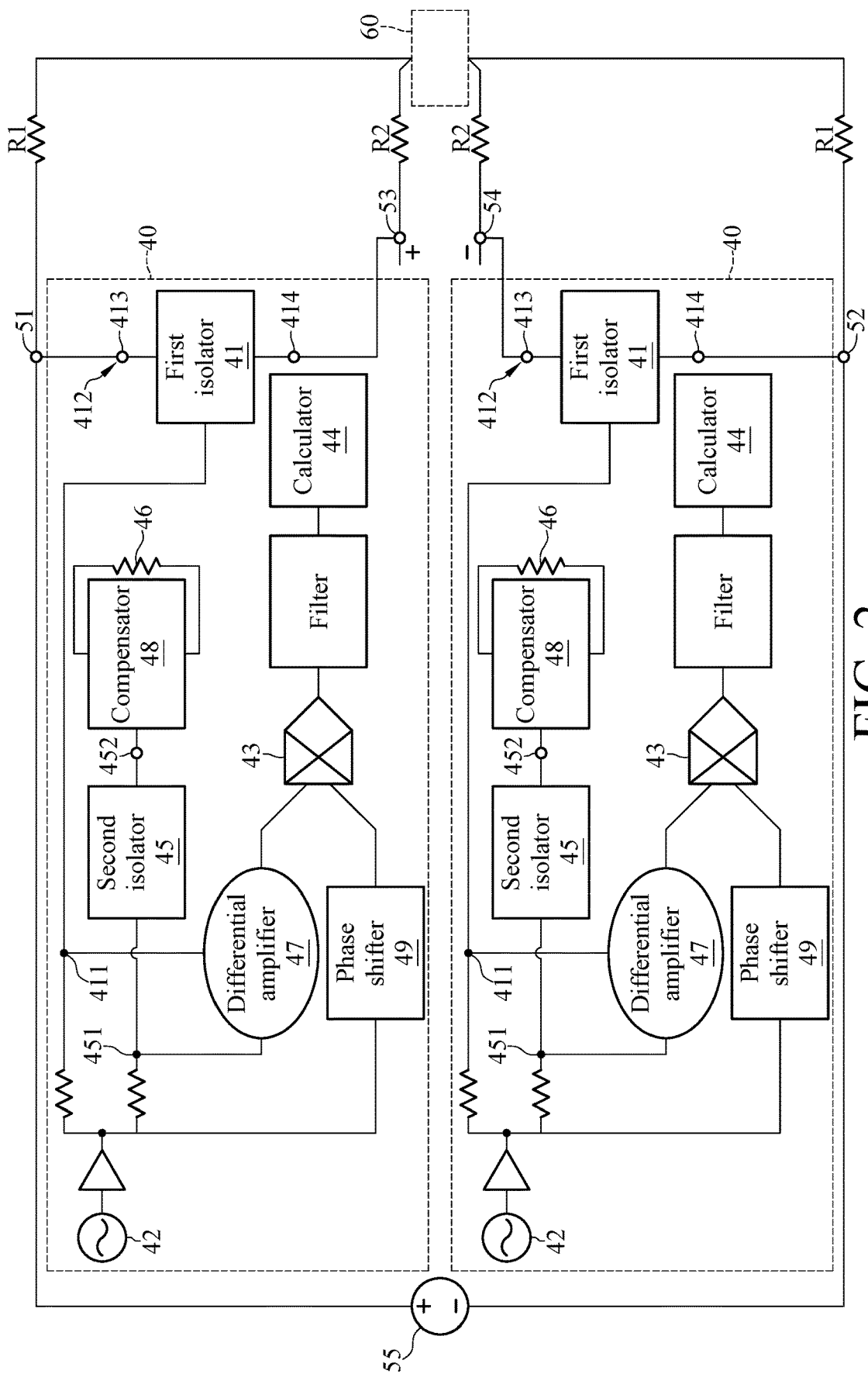
FIG. 2 is a schematic diagram of a contact detection circuit in another embodiment of this disclosure.

Please refer to FIG. 2. FIG. 2 is a schematic diagram of a contact detection circuit in another embodiment of this disclosure. As shown in FIG. 2, a contact detection circuit 40 is configured to measure the contact resistance between a driving terminal 51 and a measuring terminal 53. In an embodiment, the subject 60 is detected by four-terminal measurement or other appropriate methods of connection and measurement. A four-terminal measurement device includes a driving terminal 51, a driving terminal 52, a measuring terminal 53 and a measuring terminal 54. The driving terminal 51 and the driving terminal 52 are electrically connected to a power generator 55, and transmit a driving signal provided by the power generator 55 to the subject 60. The measuring terminal 53 and the measuring terminal 54 are electrically connected to the subject 60, and configured to transmit the signal which is generated by the subject 60 based on the driving signal to a measuring instrument or another appropriate device; thereby, the measuring instrument or said another appropriate device determines the characteristic of the subject 60. For the driving terminal 51 and the measuring terminal 53 which are connected to the same terminal of the subject, the contact resistance is related to the contact resistance between the driving terminal 51 and the subject 60, and that between the measuring terminal 53 and the subject 60. For the convenience of illustration, the contact resistance is shown as resistors R1 and R2. For example, the resistor R1 indicates the contact resistance between the driving terminal 51 and the subject 60, and the resistor R2 indicates the contact resistance between the measuring terminal 53 and the subject 60.

Similarly, for the convenience of explanation, the contact detect circuit 10 disposed between the driving terminal 51 and the measuring terminal 53 is exemplified. A person having ordinary skill in the art may infer the method of the implementation of the contact detection circuit 60 disposed between the driving terminal 52 and the measuring terminal 54 so that the related details are not described herein.

The contact detection circuit 40 includes a first isolator 41, a signal generator 42, a multiplier 43, a calculator 44, a second isolator 45, a resistor component 46, a differential amplifier 47, a compensator 48, a phase shifter 49, matching resistors and a buffer. The matching resistors and the buffer are approximately identical to those in the above embodiments so the related details are not repeated. The first isolator 41 has a primary side 411 and a secondary side 412, with the secondary side 412 including a first terminal 413 and a second terminal 414. The first terminal 413 of the secondary side 412 is electrically connected to the driving terminal 51, and the second terminal 414 is electrically connected to the measuring terminal 53. The signal generator 42 is electrically connected to the primary side 411 of the first isolator 41 and the primary 451 of the second isolator 45 via the matching resistors and the buffer, and electrically connected to multiplier 43 via the phase shifter 49. The signal generator 42 is configured to provide a measuring signal to the first isolator 41, the second isolator 45 and the multiplier 43. The resistor component 46 and the compensator 48 are electrically connected to the secondary side 452 of the second isolator 45. The differential amplifier 47 is electrically connected to the primary side 411 of the first isolator 41 and the primary side 451 of the second isolator 45. The differential amplifier 47 is configured to generate a comparison signal based on the first reflected signal at the primary side 411 of the first isolator 41 and the second reflected signal at the primary side 451 of the second isolator 45 when the signal generator 42 outputs the measuring signal to the first isolator 41 and the second isolator 45. The multiplier 43 is electrically connected to the signal generator 42 and the differential amplifier 47, and generates an output signal according to the comparison signal generated by the differential amplifier 47 and the measuring signal output by the signal generator 42. The calculator 44 is electrically connected to the multiplier 43 and calculates the contact resistance between the driving terminal 51 and the measuring terminal 53 according to the direct-current component of the output signal.

More specifically, the measuring signal provided by the signal generator 42 is a sine wave or another appropriate measuring wave. Being exemplified as a sine wave, the measuring signal is transmitted to the primary side 411 of the first isolator 41 and the primary side 451 of the second isolator 45 after passing through the buffer and the matching resistor. When the measuring signal passes through the primary side 411 of the first isolator 41, a first induced measuring signal is induced based on the measuring signal at the secondary side 412 of the first isolator 41, and then the first induced measuring signal is transmitted to the driving terminal 51 and the measuring terminal via the first terminal 413 and the second terminal 414 of the first isolator 41 respectively. Similarly, when the measuring signal passes through the primary side 451 of the second isolator 45, a second induced measuring signal is induced based on the measuring signal at the secondary side 453 of the second isolator 45, and then second induced measuring signal is transmitted to the compensator 48 and the resistor component 46. The first induced measuring signal is transmitted on a first current path which is formed by the first isolator 41 and the subject 60 so as to induce a first reflected signal at the primary side 411 of the first isolator 41. Similarly, the second induced measuring signal is transmitted on a second current path which is formed by the compensator 48 and the resistor component 46 so as to induce a second reflected signal at the primary side 451 of the second isolator 45.

For example, the first isolator 41 and the second isolator are transformers, couplers or other appropriate components. The primary side 411 and the secondary side 412 of the first isolator 41 are isolated from each other. The first isolator 41 receives the measuring signal by the primary side 411, and induces the first induced measuring signal at the secondary side 412, and then the loop circuit between the secondary side 412 and the subject 60 generates the first response signal to respond to the first induced measuring signal. When the first response signal passes through the first isolator 41, the first reflected signal is induced at the primary side 411 of the first isolator 41.

Similarly, the second isolator 45 receives the measuring signal by the primary side 451, and induces the second induced measuring signal at the secondary side 452, and then the loop circuit between the compensator 48 and the resistor component 46 generates a second response signal based on the second induced measuring signal. When the second response signal passes through the second isolator 45, the second reflected signal is induced at the primary side 451 of the second isolator 45. In an embodiment, the compensator 48 is configured to make the phase difference between the measuring signal and the first reflected signal equal to the phase difference between the measuring signal and the second reflected signal. For example, the transmission period of the measuring signal on the first current path is different from that of the measuring signal on the second current path. The compensator 48 can compensates the transmission period of the measuring signal on the second current path so as to make the phase of the second reflected signal is equal to that of the first reflected signal. In practice, the compensator 48 may adjust the transmission period of the measuring signal on the second current path by predicting the transmission period of the measuring signal on the first current path, but this disclosure is not limited to it.

The first reflected signal generated at the primary side 411 of the first isolator 41 is transmitted to the first input terminal of the differential amplifier 47, and the second reflected signal generated at the primary side 451 of the second isolator 45 is transmitted to the second input terminal of the differential amplifier 47. In an embodiment, the differential amplifier 47 subtracts the first reflected signal from the second reflected signal to generate a comparison signal and transmits the comparison signal to the first input terminal of the multiplier 43.

On the other hand, the measuring signal outputted by the signal generator 42 is adjusted by the phase shifter 49 and then transmitted to the second input terminal of the multiplier 43. The phase shifter 49 is configured to adjust the measuring signal based on the phase difference between the comparison signal and the measuring signal to obtain an adjusted measuring signal with the phase equal to that of the comparison signal. In practice, the phase shifter 49 may adjust the phase of the measuring signal by predicting the phase difference between the comparison signal and the measuring signal, or by receiving the comparison signal and determining the phase difference between said two signals; it's not limited in this disclosure. When the multiplier 43 receives the comparison signal and the measuring signal which have the same phase, the multiplier 43 multiply the comparison signal and the adjusted measuring signal together to generate the output signal. The calculator 44 calculates the contact resistance based on the direct-current component of the output signal. In other words, the multiplier 43 converses the comparison signal into the output signal so that the calculator 44 may easily determines the detection result related to the contact resistance based on the direct-current component of the output signal.

In an embodiment, the output signal generated by the multiplier 43 is further transmitted to a filter. The filter filters the output signal and provides the calculator 44 with the direct-current component of the output signal, and then the calculator 44 determines whether the contact resistance is lower than that of the resistor component 46 according to the direct-current component of the output signal.

For a practical example, the first reflected signal is A $\sin(\omega t+\theta_1)$, the second reflected signal is B $\sin(\omega t+\theta_1)$, and the comparison signal which is generated by subtracting the first reflected signal from the second reflected signal is $|A-B|\sin(\omega t+\theta_1)$ or $-|A-B|\sin(\omega t+\theta_1)$. The comparison signal and the adjusted measuring signal C $\sin(\omega t+\theta_1)$ of which the phase is adjusted to be equal to the phase of the comparison signal multiply with each other as follows:

$$|A-B|\sin(\omega t+\theta_1) \times C\sin(\omega t+\theta_1) = \frac{C|A-B|}{2}[\cos(0) - \cos(2\omega t + 2\theta_1)] \text{ or}$$

$$-|A-B|\sin(\omega t+\theta_1) \times C\sin(\omega t+\theta_1) =$$

$$\frac{-C|A-B|}{2}[\cos(0) - \cos(2\omega t + 2\theta_1)]$$

Because whether the comparison signal is |A−B|sin(ωt+θ₁) or −|A−B|sin(ωt+θ₁) is based on whether the contact resistance is lower than the resistance of the resistor component 46, the calculator 44 may determine whether the contact resistance is lower than the resistance of the resistor component 46 based on whether the direct-current component of the output signal is $$\frac{C|A-B|}{2}\cos(0) \text{ or } \frac{-C|A-B|}{2}\cos(0).$$

In practice, when the subject 60 is detected by merely providing the measuring signal to the subject 60 and detecting the contact resistance according to the reflected signal of the subject 60, the reflected signal is easily ignored so that the contact resistance cannot be detected. To overcome the above problem, in this embodiment, a second current path is formed by the second isolator 45 and the resistor component 46. When the first current path responds to the measuring signal, the second current path also responds to the measuring signal so that the reflected signal of the contact resistance is not easy to be ignored. Moreover, the multiplier 43 multiplies the comparison signal and the measuring signal to obtain the output signal including the direct-current component so that the calculator 44 may easily determine the relation between the contact resistance and the resistor component 46 according to the direct-current component of the output signal.

Figure 3:
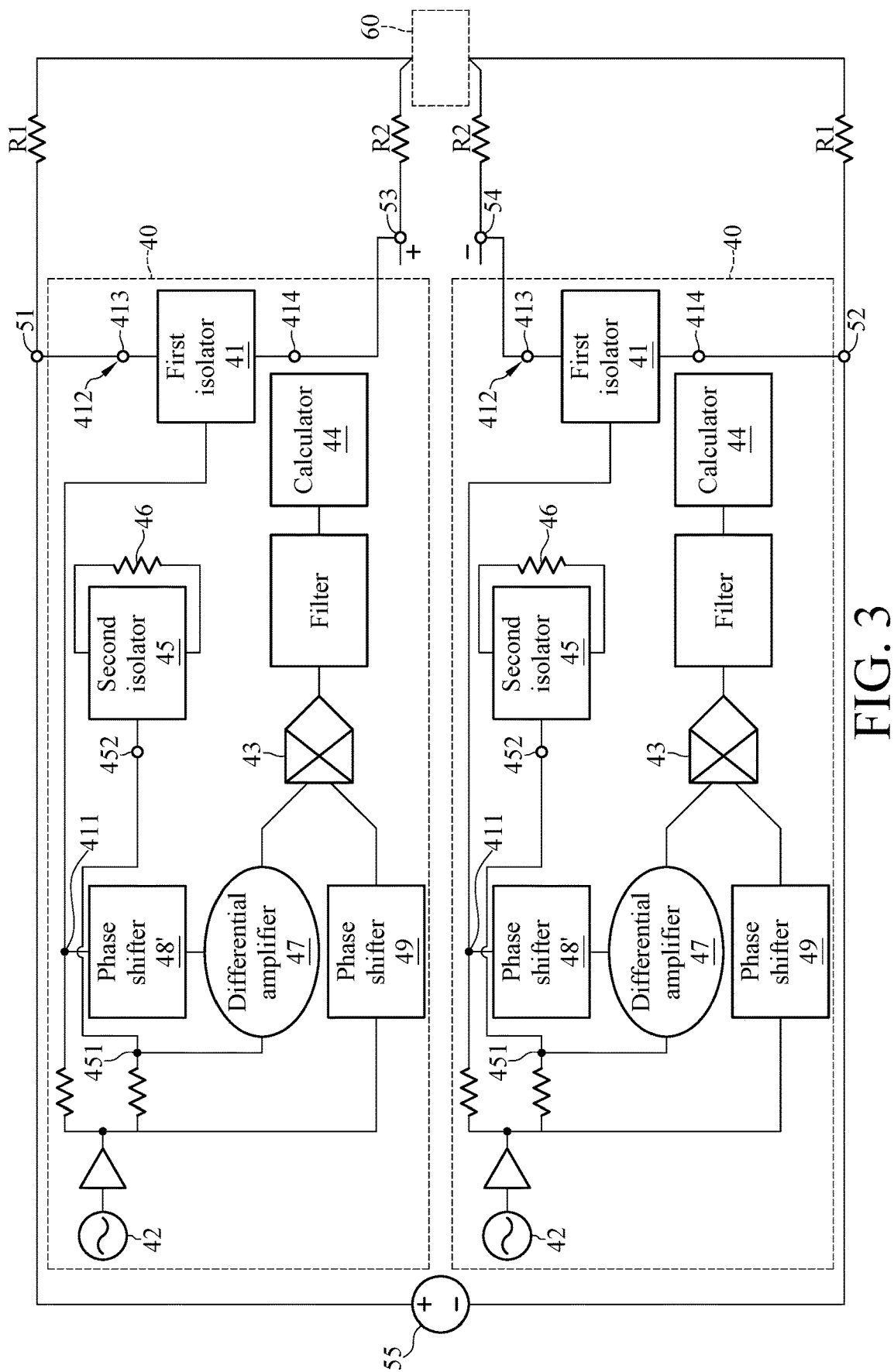
FIG. 3 is a schematic diagram of a contact detection circuit in yet another embodiment of this disclosure.

In this embodiment, the compensator 48 is configured to make the phase difference between the measuring signal and the first reflected signal equal to that between the measuring signal and the second reflected signal. In another embodiment, please refer to FIG. 3 which is a schematic diagram of a contact detection circuit in yet another embodiment of this disclosure. As shown in FIG. 3, the contact detection circuit 40 is electrically connected between the primary side 411 of the first isolator 41 and the differential amplifier 47 via another phase shifter 48'. In other words, when there is a phase difference between the first reflected signal generated at the primary side 411 of the first isolator 41 and the second reflected signal, the phase shifter 48' adjusts the phase of the first reflected signal based on said phase difference between the first reflected signal and the second reflected signal, so that the differential amplifier 47 generates the comparison signal based on the adjusted first reflected signal and the second reflected signal. In another embodiment, the phase shifter may be electrically connected between the primary side 451 of the second isolator 45 and the differential amplifier 47, and adjusts the phase of the second reflected signal based on the phase difference between the first reflected signal and the second reflected signal; it's not limited in this disclosure.

In FIG. 3, the first isolator 41, the signal generator 42, the multiplier 43, the calculator 44, the second isolator 45, the resistor component 46, the differential amplifier 47 and the phase shifter 49 are approximately identical to those in the aforementioned embodiments so that the related details are not repeated.

In the aforementioned embodiments, the phase shifter 49 is, for example, a delay adjuster or other components capable of adjusting the phase of a signal. In this embodiment, the phase shifter 49 is disposed between the signal generator 42 and the multiplier 43 to adjust the phase of the measuring signal to be equal to that of the first reflected signal. In another embodiment, the phase shifter 49 can also be disposed between the differential amplifier 47 and the multiplier 43 to adjust the phase of the comparison signal to be equal to that of the measuring signal; it's not limited in this disclosure.

For the convenience of explanation, the contact detection circuit 40 including the compensator 48, the phase shifter 49, the matching resistor and the buffer is exemplified. However, the compensator 48, the phase shifter 49, the matching resistor and the buffer are dispensable components for the contact detection circuit 10. A person having ordinary skill in the art can delete one or more of the compensator 48, the phase shifter 49, the matching resistor and the buffer or replace one or more of them with other appropriate components according to practical requirements. Moreover, a person having ordinary skill in the art can also add, for example, the converter shown in FIG. 1 or other appropriate components into the contact detection circuit 40; it's not limited in this disclosure.

Besides being disposed between the driving terminal 51 and the measuring terminal 53, the contact detection circuit 40 can also be disposed between the driving terminal 52 and the measuring terminal 53 in order to detect the contact resistance between the driving terminal 52 and the measuring terminal 54. Although the implementation that the contact detection circuit 40 is disposed between the driving terminal 52 and the measuring terminal 54 does not go into details, this disclosure does not intend to limit that the contact detection circuit 40 can merely be disposed between the driving terminal 51 and the measuring terminal 53.

In view of the above description, this disclosure provides a contact detection circuit of a four-terminal measurement device. The contact detection circuit provides a measuring signal to a driving terminals and a measuring terminal to generate a first reflected signal based on the measuring signal at the primary side of the isolator of the contact detection circuit, with the first reflected signal related to the contact resistance between the driving terminal and the measuring terminal. Afterwards, the multiplier generates an output signal with a direct-current component based on the first reflected signal and the measuring signal, so that the calculator of the contact detection circuit may easily determine the detection result of the contact resistance based on the direct-current component of the output signal; thereby, not only the speed but also the accuracy of detection increases.

What is claimed is:

1. A contact detection circuit, applied to a four-terminal measurement device, comprising:
   a first isolator comprising a primary side and a secondary side, with the secondary side comprising a first terminal and a second terminal, with the first terminal configured to be electrically connected to a driving terminal and the second terminal configured to be electrically connected to a measuring terminal;
   a signal generator electrically connected to the primary side of the first isolator, and configured to provide a measuring signal;
   a multiplier electrically connected to the signal generator and the primary side of the first isolator, and configured to generate an output signal based on the measuring signal and a first reflected signal when the first reflected signal is induced at the primary side of the first isolator based on a response signal at the secondary side of the first isolator, wherein the response signal is generated to respond to the measuring signal; and
   a calculator electrically connected to the multiplier and configured to calculate a contact resistance between the driving terminal and the measuring terminal based on a direct-current component of the output signal.

2. The contact detection circuit according to claim 1, further comprising:
a delay adjuster electrically connected to the signal generator and the multiplier, and configured to adjust a phase of the first reflected signal or a phase of the measuring signal to obtain an adjusted first reflected signal or an adjusted measuring signal based on a phase difference between the first reflected signal and the measuring signal;
wherein the multiplier generates the output signal based on the adjusted first reflected signal and the measuring signal, or based on the first reflected signal and the adjusted measuring signal.

3. The contact detection circuit according to claim 1, further comprising a filter and a converter, wherein the filter is electrically connected to the multiplier and the converter, the converter is electrically connected to the calculator, the filter filters the output signal outputted by the multiplier and provides the converter with the direct-current component of the output signal, the converter converts the direct-current component of the output signal to a measured value, and the calculator calculates the contact resistance based on the measured value.

4. The contact detection circuit according to claim 1, further comprising:
a second isolator comprising a primary side and a secondary side, with the primary side of the second isolator electrically connected to the signal generator;
a resistor component electrically connected to the secondary side of the second isolator, and when the first terminal and the second terminal of the first isolator receives the measuring signal, the resistor component receiving the measuring signal, generating a second reflected signal based on the measuring signal, and transmitting the second reflected signal to the primary side of the second isolator; and
a differential amplifier electrically connected to the primary side of the first isolator and the primary side of the second isolator, and generating a comparison signal based on the first reflected signal and the second reflected signal;
wherein the multiplier generates the output signal based on the comparison signal and the measuring signal.

5. The contact detection circuit according to claim 4, further comprising:
a compensator electrically connected to the second isolator, and configured to make a phase difference between the measuring signal and the second reflected signal equal to a phase difference between the measuring signal and the first reflected signal;
wherein the phase difference between the measuring signal and the first reflected signal is related to a first current path formed by the first isolator, the driving terminal and the measuring terminal, and the phase difference between the measuring signal and the second reflected signal is related to a second current path formed by the compensator and the resistor component.

6. The contact detection circuit according to claim 4, further comprising:
a first phase shifter electrically connected to the differential amplifier and one of the primary sides of the second isolator and the first isolator, and adjusting a phase of the first reflected signal or a phase of the second reflected signal based on a phase difference between the first reflected signal and the second reflected signal to obtain an adjusted first reflected signal or an adjusted second reflected signal;
wherein the differential amplifier generates the comparison signal based on the adjusted first reflected signal and the second reflected signal, or generates the comparison signal based on the first reflected signal and the adjusted second reflected signal.

7. The contact detection circuit according to claim 4, further comprising:
a second phase shifter electrically connected to the multiplier and one of the signal generator and the differential amplifier, and adjusting a phase of the comparison signal or a phase of the measuring signal based on a phase difference between the comparison signal and the measuring signal to obtain an adjusted comparison signal or an adjusted measuring signal;
wherein the multiplier generates the output signal based on the adjusted comparison signal and the measuring signal, or generates the output signal based on the comparison signal and the adjusted measuring signal.

8. The contact detection circuit according to claim 4, further comprising:
a filter electrically connected to the multiplier and the calculator, filtering the output signal outputted by the multiplier, and providing the calculator with the direct-current component of the output signal.

9. The contact detection circuit according to claim 4, wherein the calculator determines whether the contact resistance is lower than resistance of the resistor component based on the direct-current component of the output signal.

* * * * *